(12) United States Patent
Whiting et al.

(10) Patent No.: US 8,089,065 B2
(45) Date of Patent: Jan. 3, 2012

(54) ORGANIC THIN FILM TRANSISTORS

(75) Inventors: Gregory Whiting, Menlo Park, CA (US); Jonathan Halls, Cambridge (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 0 days.

(21) Appl. No.: 12/529,286

(22) PCT Filed: Apr. 3, 2008

(86) PCT No.: PCT/GB2008/001183
§ 371 (c)(1),
(2), (4) Date: Oct. 26, 2009

(87) PCT Pub. No.: WO2008/122774
PCT Pub. Date: Oct. 16, 2008

(65) Prior Publication Data
US 2010/0032662 A1 Feb. 11, 2010

(30) Foreign Application Priority Data

Apr. 4, 2007 (GB) .................................. 0706653.3

(51) Int. Cl.
*H01L 35/24* (2006.01)
(52) U.S. Cl. .............................. 257/40; 257/49; 257/66
(58) Field of Classification Search .................... 257/40, 257/49, 66
See application file for complete search history.

(56) References Cited

U.S. PATENT DOCUMENTS

| 5,884,397 A * | 3/1999 | Armezzani et al. ............. 29/840 |
| 6,433,359 B1 | 8/2002 | Kelley et al. |
| 2006/0060855 A1 | 3/2006 | Lee et al. |
| 2006/0220022 A1 | 10/2006 | Moriya |

FOREIGN PATENT DOCUMENTS

| JP | 2005-072053 | * | 3/2005 |
| JP | 2005072053 A | | 3/2005 |
| JP | 2005108949 A | | 4/2005 |
| WO | WO-2005038881 A2 | | 4/2005 |

OTHER PUBLICATIONS

International Search Report and Written Opinion for PCT/GB2008/001183 dated Aug. 20, 2008.
International Preliminary Report on Patentability for Application No. PCT/GB2008/001183, dated Oct. 6, 2009.

* cited by examiner

*Primary Examiner* — Long Pham
(74) *Attorney, Agent, or Firm* — Marshall, Gerstein & Borun LLP

(57) ABSTRACT

A method of forming an organic thin film transistor comprising: providing a structure comprising source and drain electrodes with a channel region therebetween, a gate electrode, and a dielectric layer disposed between the source and drain electrodes and the gate electrode; and patterning the dielectric layer using the source and drain electrodes as a mask to form a region of dielectric material in the channel region which is thinner than regions of dielectric material adjacent the channel region.

14 Claims, 3 Drawing Sheets

PRIOR ART

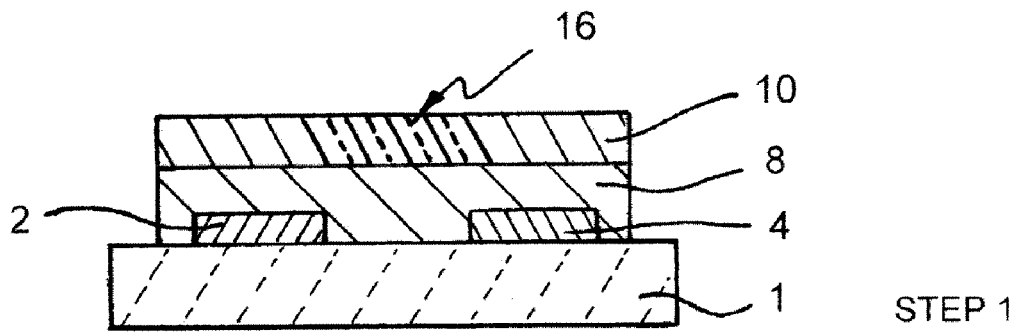
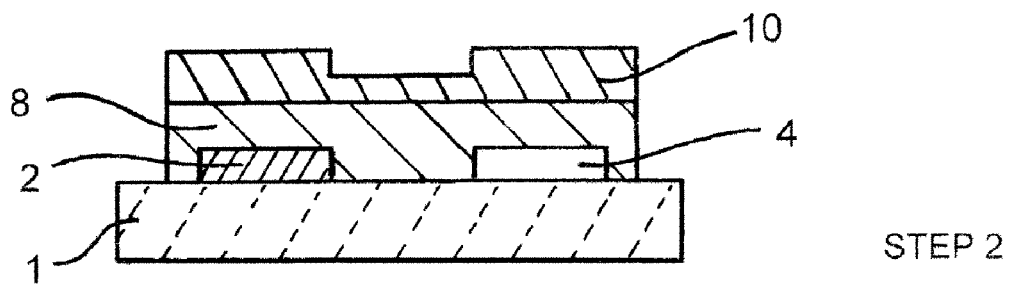
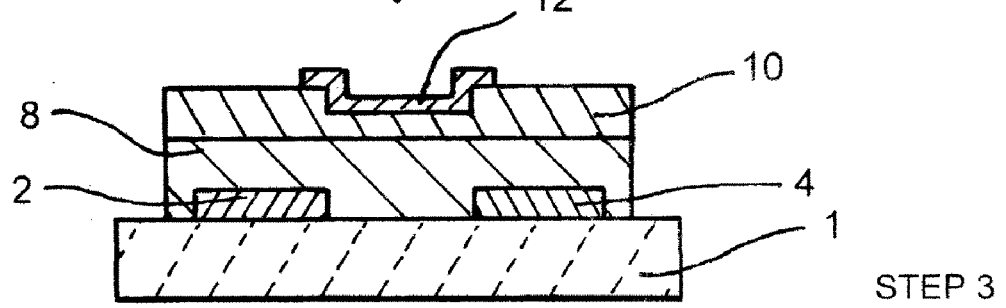
Fig. 4

ORGANIC THIN FILM TRANSISTORS

FIELD OF INVENTION

The present invention relates to organic thin film transistors.

BACKGROUND OF THE INVENTION

Transistors can be divided into two main types: bipolar junction transistors and field-effect transistors. Both types share a common structure comprising three electrodes with a semi-conductive material disposed therebetween in a channel region. The three electrodes of a bipolar junction transistor are known as the emitter, collector and base, whereas in a field-effect transistor the three electrodes are known as the source, drain and gate. Bipolar junction transistors may be described as current-operated devices as the current between the emitter and collector is controlled by the current flowing between the base and emitter. In contrast, field-effect transistors may be described as voltage-operated devices as the current flowing between source and drain is controlled by the voltage between the gate and the source.

Transistors can also be classified as p-type and n-type according to whether they comprise semi-conductive material which conducts positive charge carriers (holes) or negative charge carriers (electrons) respectively. The semi-conductive material may be selected according to its ability to accept, conduct, and donate charge. The ability of the semi-conductive material to accept, conduct, and donate holes or electrons can be enhanced by doping the material. The material used for the source and drain electrodes can also be selected according to its ability to accept and inject holes or electrodes. For example, a p-type transistor device can be formed by selecting a semi-conductive material which is efficient at accepting, conducting, and donating holes, and selecting a material for the source and drain electrodes which is efficient at injecting and accepting holes from the semi-conductive material. Good energy-level matching of the Fermi-level in the electrodes with the HOMO level of the semi-conductive material can enhance hole injection and acceptance. In contrast, an n-type transistor device can be formed by selecting a semi-conductive material which is efficient at accepting, conducting, and donating electrons, and selecting a material for the source and drain electrodes which is efficient at injecting electrons into, and accepting electrons from, the semi-conductive material. Good energy-level matching of the Fermi-level in the electrodes with the LUMO level of the semi-conductive material can enhance electron injection and acceptance.

Transistors can be formed by depositing the components in thin films to form thin film transistors. When an organic material is used as the semi-conductive material in such a device, it is known as an organic thin film transistor (OTFT). OTFTs may be manufactured by low cost, low temperature methods such as solution processing. Moreover, OTFTs are compatible with flexible plastic substrates, offering the prospect of large-scale manufacture of OTFTs on flexible substrates in a roll-to-roll process.

Various arrangements for organic thin film transistors are known. One such device is an insulated gate field-effect transistor which comprises source and drain electrodes with a semi-conductive material disposed therebetween in a channel region, a gate electrode disposed adjacent the semi-conductive material and a layer of insulating material disposed between the gate electrode and the semi-conductive material in the channel region.

An example of such an organic thin film transistor is shown in FIG. 1. The illustrated structure may be deposited on a substrate (not shown) and comprises source and drain electrodes 2, 4 which are spaced apart with a channel region 6 located therebetween. An organic semiconductor (OSC) 8 is deposited in the channel region 6 and may extend over at least a portion of the source and drain electrodes 2, 4. An insulating layer 10 of dielectric material is deposited over the organic semi-conductor 8 and may extend over at least a portion of the source and drain electrodes 2, 4. Finally, a gate electrode 12 is deposited over the insulating layer 10. The gate electrode 12 is located over the channel region 6 and may extend over at least a portion of the source and drain electrodes 2, 4.

The structure described above is known as a top-gate organic thin film transistor as the gate is located on a top side of the device. Alternatively, it is also known to provide the gate on a bottom side of the device to form a so-called bottom-gate organic thin film transistor.

An example of such a bottom-gate organic thin film transistor is shown in FIG. 2. In order to show more clearly the relationship between the structures illustrated in FIGS. 1 and 2, like reference numerals have been used for corresponding parts. The bottom-gate structure illustrated in FIG. 2 comprises a gate electrode 12 deposited on a substrate 1 with an insulating layer 10 of dielectric material deposited thereover. Source and drain electrodes 2, 4 are deposited over the insulating layer 10 of dielectric material. The source and drain electrodes 2, 4 are spaced apart with a channel region 6 located therebetween over the gate electrode. An organic semiconductor (OSC) 8 is deposited in the channel region 6 and may extend over at least a portion of the source and drain electrodes 2, 4.

The conductivity of the channel can be altered by the application of a voltage at the gate. In this way the transistor can be switched on and off using an applied gate voltage. The drain current that is achievable for an organic thin film transistor is inversely proportional to the thickness of the dielectric in the active region of the device (channel between source and drain electrodes). Thus, in order to achieve high drain currents with low operational voltages, organic thin film transistors must have thin dielectric layers in the channel region.

A thin dielectric layer in the channel region is therefore desirable in order to achieve high drain currents with low operational voltages. However, it is typically difficult to solution process very thin dielectric layers (<100 nm), as this often leads to substantial leakage pathways to the gate electrode, due to defects in the thin dielectric film. Thus, a thin dielectric layer can often lead to shorting or leakage pathways between the metallisation on either side of the dielectric layer and also an increase in parasitic capacitance.

In prior art arrangements, such as that illustrated in FIGS. 1 and 2, this problem may be solved by increasing the thickness of gate insulating material. However, if the thickness of the gate insulating material is increased in the channel region, then a larger voltage will be required to turn on the transistor and a larger operational voltage is required to attain a given current. For example, for an organic dielectric material, a film of approximately 1 µm can be reliably spun deposited to provide a good homogenous film. However, such a dielectric layer may require of the order of 30-60 volts applied to the gate in order to attain a reasonable operating current.

Accordingly, one solution would be to only increase the thickness of the gate insulating material in the area where the gate and source/drain overlap and provide a thin layer of dielectric material in the channel region. Such a solution is known from the documents discussed below.

US 2006/060855 discloses a top-gate device with an extra insulating layer only in the region where the gate and the source/drain electrodes overlap. This extra insulating layer is deposited over the main gate dielectric layer and patterned prior to deposition of the gate. In another top-gate device arrangement disclosed in this document, a single layer of gate insulator material is deposited. The gate insulator is formed by masking such that the gate insulator disposed below the gate electrode and above the source and drain regions is greater than the thickness of a portion of the gate insulator disposed above the channel region of the organic semi-conductive layer. Alternatively, the gate insulator can be formed by depositing a gate insulator on the entire upper surface of the organic semi-conductive layer and then removing at least a portion of the gate insulator disposed above the channel region of the organic semi-conductive layer.

US 2006/220022 discloses a top-gate device with a gate insulating layer having variable thickness. The gate insulating layer is thinner in a central region thereof over the channel and is thicker at peripheral regions where the gate overlaps the source/drain. The variation in thickness of the gate insulating layer is achieved by adjusting the drying rate of the layer during formation such that the peripheral regions dry more quickly than the central region over the channel. As a result, more material is precipitated at the peripheral regions than in the central region.

One problem with both the aforementioned arrangements is that they require extra dielectric material to be deposited over the organic semi-conductive layer which may damage the organic semi-conductive layer. Another problem with both the aforementioned arrangements is that it is difficult to align all the overlying layers in the device, such as alignment of the thin portion of the gate dielectric layer with the channel region. Furthermore, containment of the organic semi-conductive material in the channel region may also be a problem.

An additional problem with the arrangements disclosed in US 2006/060855 is that they require additional masking steps to pattern the dielectric layer.

An additional problem with the arrangement disclosed in US 2006/220022 is that the gate dielectric layer of variable thickness may be difficult to form in a reproducible manner in order to form devices having uniform properties.

JP 2005-108949 discloses an OTFT in which the contact area between the gate dielectric and the organic semiconductor is offset by a height of 10-40 nm from the contact area between the gate dielectric and the source and drain electrodes. This construction is not provided for the purpose of reducing parasitic capacitance. Moreover, the organic semiconductor is deposited by thermal evaporation rather than by a solution processing method.

It is one aim of embodiments of the present invention to provide a solution to one or more of the problems discussed above.

SUMMARY OF INVENTION

According to a first aspect of the present invention, there is provided a method of forming an organic thin film transistor comprising: providing a structure comprising source and drain electrodes with a channel region therebetween, a gate electrode, and a dielectric layer disposed between the source and drain electrodes and the gate electrode; and patterning the dielectric layer using the source and drain electrodes as a mask to form a region of dielectric material in the channel region which is thinner than regions of dielectric material adjacent the channel region.

According to an embodiment of the present invention, there is provided a method of forming a bottom-gate organic thin film transistor comprising: forming a gate electrode on a substrate; forming a dielectric layer over the gate electrode; forming a source and drain electrode over the dielectric layer, the source and drain electrode being spaced apart with a channel region therebetween located over the gate electrode; etching the dielectric layer in the channel region using the source and drain electrodes as an etch mask to reduce the thickness of the dielectric layer in the channel region; and forming a layer of organic semi-conductive material in at least the channel region between the source and drain electrodes.

Embodiments of the present invention provide a thicker dielectric region around peripheral areas of the organic thin film transistor where the source/drain electrodes and the gate electrode overlap. This thicker region serves to isolate the peripheral areas of the gate from the source and drain so as to minimise capacitance and gate leakage to the source and drain. A thinner dielectric region is provided in the channel region between the source and drain electrodes so as to minimize turn-on voltage.

Furthermore, by using the source and drain electrodes as an etch mask, the thinner region of the dielectric layer is automatically aligned with the electrode layers. In addition, by using the source and drain electrodes as an etch mask, no further masking steps are required in patterning the dielectric layer to form the thinner region of the dielectric layer in the channel region.

After etching the dielectric layer, a well is formed in which the organic semi-conductive material is deposited which serves to contain the semi-conductive material in the channel region. Furthermore, as the dielectric layer is deposited prior to deposition of the organic semi-conductive layer, it may be deposited and etched without damaging the organic semi-conductive layer. The structure can be formed in a reproducible manner using known deposition and etching techniques to produce devices having uniform properties with low turn-on voltage and low capacitance and gate leakage to the source and drain.

According to another embodiment of the present invention there is provided a method of forming a top-gate organic thin film transistor comprising: forming a source and drain electrode over a transparent substrate, the source and drain electrode being spaced apart with a channel region therebetween; forming a layer of organic semi-conductive material in at least the channel region between the source and drain electrodes; forming a dielectric layer over the layer of organic semi-conductive material, wherein light is projected though the transparent substrate to treat the dielectric layer in the channel region forming a region of the dielectric layer in the channel region which is preferentially etchable relative to regions of the dielectric layer over the source and drain electrodes; etching said region of the dielectric layer in the channel region to reduce the thickness of the dielectric layer in the channel region; and depositing a gate electrode over the dielectric layer in at least the channel region.

This embodiment of the present invention provides a top-gate organic thin film transistor which has similar advantageous properties to the bottom-gate organic thin film transistor provided by the previously described embodiment of the present invention.

According to all the embodiments, both top-gate and bottom gate, the source and drain electrodes act as a mask for patterning the dielectric layer in order to provide a region of dielectric material in the channel region which is thinner than regions of dielectric material around the periphery of the channel region where the source and drain electrodes may overlap with the gate electrode.

Embodiments of the present invention provide self-alignment of the thinner region of the dielectric layer with the channel region defined by the source and drain electrodes. The self-aligning process can reduce processing steps and results in a thick dielectric layer between the source/drain and the gate in overlapping regions away from the channel region. This solution also allows the physical width of the gate to be enlarged (i.e. so that it can be printed) without undue increase in capacitance and current leakage. That is, because a thicker region of dielectric material is provided in the overlapping regions, a large overlap between the electrodes will not unduly increase capacitance and current leakage. Thus, embodiments of the present invention provide a simple process by which a thin region of dielectric material can be aligned with the channel region between the source and drain electrodes while reducing capacitance and gate leakage. Furthermore, the gate can be printed or deposited using other simple patterning techniques.

Another advantage of this method is that the dielectric layer may also be required to serve as an insulating spacer between rows and columns defined by the gate metallisation and source drain metallisation in, for example, a light-emissive display. In this case a thicker dielectric is required to reduce parasitic capacitance, leakage and the probability of shorts at row/column crossing points. Without the etch-back technique a thicker dielectric layer would lead to high gate voltage requirements for the organic thin film transistors.

Furthermore, in some regions it may be preferred that the exposed dielectric is not thinned, for example, where later metallisation (e.g. a cathode electrode layer in a light-emissive display) is preferred to be well spaced from metallisation on the substrate. In this case a protective layer that inhibits or slows etching may be deposited and patterned on the surface. Examples of protective layers include photoresist that can be patterned using photolithography. The protective layer may also be deposited by ink jet printing.

According to another aspect of the present invention there is provide an organic thin film transistor comprising: a substrate; a gate electrode disposed on a substrate; a dielectric layer disposed over the gate electrode; a source and drain electrode disposed over the dielectric layer, the source and drain electrode being spaced apart with a channel region therebetween located over the gate electrode; and a layer of organic semi-conductive material disposed in at least the channel region between the source and drain electrodes, wherein the dielectric layer in the channel region between the source and drain electrodes is thinner than regions under the source and drain electrodes.

According to another aspect of the present invention there is provided an organic thin film transistor comprising: a source and drain electrode disposed over a transparent substrate, the source and drain electrode being spaced apart with a channel region therebetween; a layer of organic semi-conductive material disposed in at least the channel region between the source and drain electrodes; a dielectric layer disposed over the layer of organic semi-conductive material; and a gate electrode disposed over the dielectric layer in at least the channel region, wherein the dielectric layer in the channel region between the source and drain electrodes is thinner than regions over the source and drain electrodes, the thinner region of the dielectric material comprising a material which is preferentially etchable relative to the material which forms the thicker regions of the dielectric layer.

BRIEF DESCRIPTION OF THE DRAWINGS

The present invention will now be described in further detail, by way of example only, with reference to the accompanying drawings in which:

FIG. 4 illustrates the method steps involved in forming an organic thin film transistor according to an alternative embodiment of the present invention.

DETAILED DESCRIPTION OF THE PREFERRED EMBODIMENTS

Figure 3:
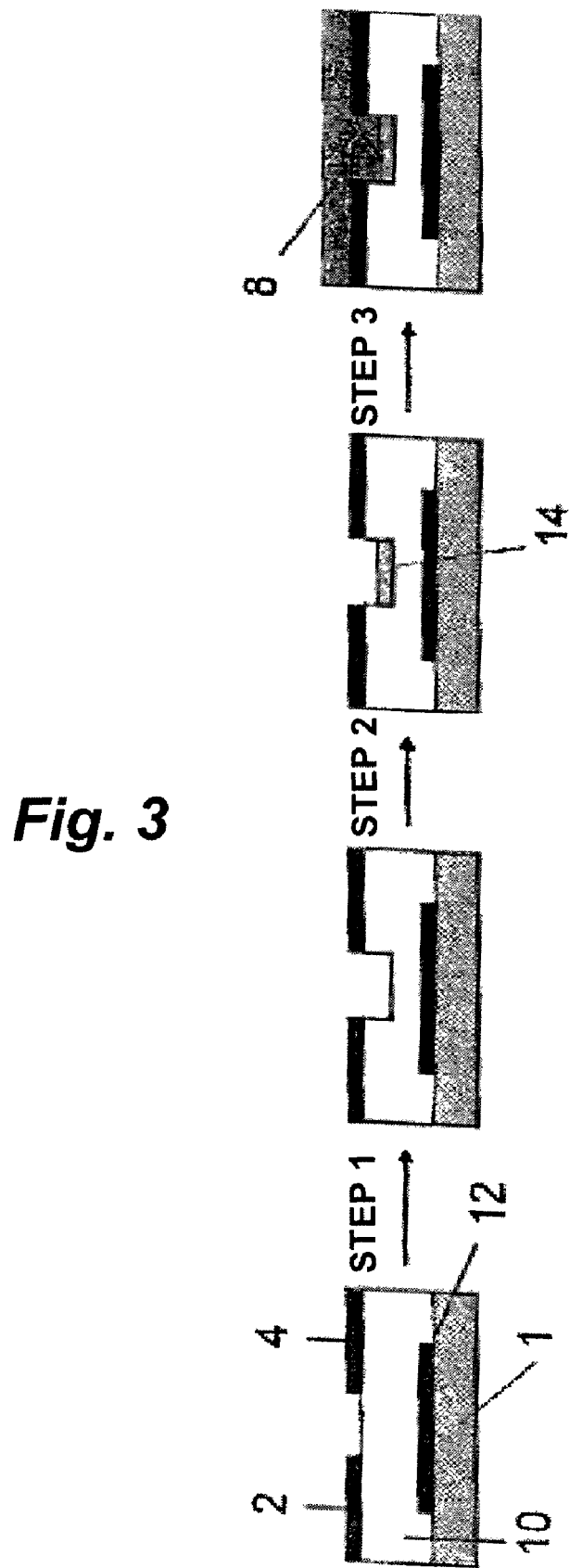
FIG. 3 illustrates the method steps involved in forming an organic thin film transistor according to an embodiment of the present invention.

An example method of how this technique may be carried out is shown schematically in FIG. 3.

A substrate is initially prepared by formation of a gate electrode 12, a thick dielectric layer 10 (~1-5 µm), which could be made of polymer or inorganic materials such as $SiO_2$. Source and drain contacts 2, 4 are then deposited (this is a bottom gate, bottom contact transistor architecture).

The dielectric layer 10 is then etched back in a controlled way in Step 1, with the source-drain contacts 2, 4 acting as a self-aligned mask for the etch. This can be carried out with either a dry or wet etching technique, as long as the etching can be controlled so that it does not completely etch through the dielectric layer. Preferably, the dielectric region is thinned to more than half its original thickness (ie ratio of thicknesses before and after patterning is more than 2:1). The thickness of the dielectric layer as measured from the substrate surface is typically in excess of 1000 nm to provide coverage of the gate electrode and at the same time providing sufficient thickness outside the channel region to reduce parasitic capacitance. Typically, the dielectric layer overlying the gate electrode is deposited to a thickness in excess of 300 nm, and so it may be patterned to a depth of at least 300 nm to form the thinner region.

As the physical and chemical properties of the dielectric interface in the channel region can be important for device operation, in an optional step, any damage to the dielectric surface caused by the etching step may be repaired as illustrated in Step 2. This can be done, for example, by deposition of a capping layer 14, for example a self-assembled monolayer (SAM), onto the exposed dielectric surface.

Example SAM materials include the trichlorosilane class of materials which form attachments to $SiO_2$ and other oxidised surfaces. Further, such trichlorosilanes include octadecyltrichlorsilane and phenylethyltrichlorosilane. If an organic dielectric is used, formation of an oxidised surface by for example oxygen plasma treatment may be required to ensure adhesion of the trichlorosilane SAM.

Other materials may also be used for the capping layer, including UV activated materials that form covalent bonds with the specific dielectric material chosen. Reactions of this type may proceed by radical chemistry, interacting with the specific chemical groups at the surface. These do not necessarily have to form a self assembled monolayer, although the layer is preferably continuous, forms a high quality upper surface and adheres well to the underlying etched dielectric surface.

The organic thin film transistor is then completed by deposition of the organic semi-conductive layer 8 as illustrated in Step 3.

Figure 1:
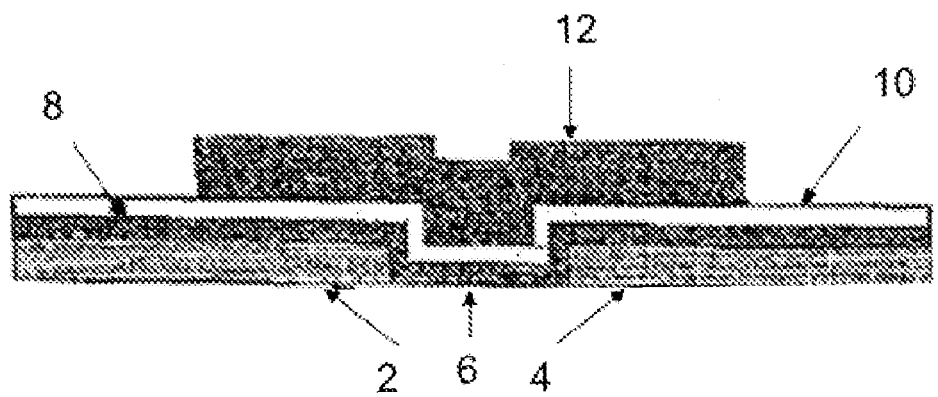
FIG. 1 shows a top-gate organic thin film transistor structure according to a prior art arrangement.
Figure 2:
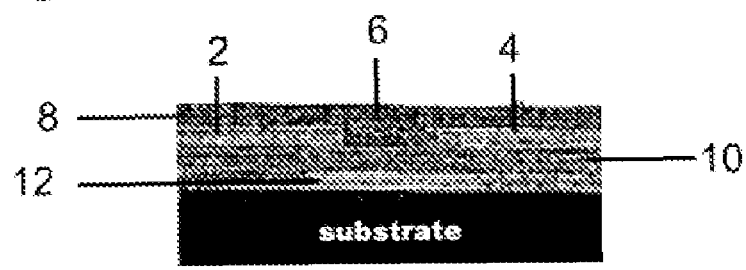
FIG. 2 shows a bottom-gate organic thin film transistor structure according to a prior art arrangement.

The resulting transistor has a similar structure to that illustrated in FIG. 2, which has been previously described in the background section. For reasons of clarity, the same reference numerals have been used as in FIG. 2 for common layers. The important difference is that in the arrangement illustrated in the final structure of FIG. 3, a thin region of dielectric material is disposed in the channel region while thick regions of dielectric material are provided under the source and drain. These thick regions of dielectric material isolate the peripheral areas of the gate electrode from the source and drain so as to minimise capacitance and gate leakage to the source and drain. The thick regions of dielectric material also serve to form a well in which the organic semi-conductive material is deposited. If the well is made very deep, the conductive path length between the source and drain may be increased. This is because the charge carriers in the organic semi-conductor tend to be transported in a region of the channel close to the dielectric. Accordingly, the charge carriers may travel from the source down into the base of the well, across the channel region, and then back up to the drain. In this case, if a deep well is desired, in order to reduce the conductive path length between the source and drain, the sides of the well may be metallised.

FIG. 3 illustrates the method steps in forming a bottom-gate organic thin film transistor wherein the substrate 1 may be opaque or transparent. In contrast, FIG. 4 illustrates the method steps involved in forming a top-gate organic thin film transistor as discussed below.

A transparent substrate 1 is initially prepared by formation of source and drain electrodes 2, 4, a layer of organic semi-conductive material 8, and a thick dielectric layer 10 (~1-5 μm), which can be made of a cross-linked polymer, the linkages of which can be broken by exposure to UV light.

In Step 1 of FIG. 4, UV light is projected through the substrate 1. The source and drain electrodes 2, 4 act as a mask such that only region 16 of the dielectric layer 10, located between the source and drain, is exposed to break the cross-linking in the polymer forming the dielectric layer.

In Step 3, the dielectric layer is controllably etched with an etchant which preferentially etches away the non-cross-linked dielectric material in the channel region. As a result, a thin portion of dielectric material is left in the channel region while thick, cross-linked regions of the dielectric layer remain above the source and drain.

Finally, in Step 3, a gate electrode 12 is deposited. Optionally, a repair step can be provided prior to depositing the gate electrode as illustrated in Step 2 of FIG. 3.

The steps of cross-linking the dielectric layer, and using the source and drain as a mask for UV treating the dielectric layer in the channel region in order to break the cross-linking in this region, may also be employed as additional steps in the method shown in FIG. 3. This may be useful in order to prevent the etchant from undercutting the source and drain.

While certain embodiments may utilize specific types of materials for the dielectric layer, e.g. cross-linkable materials in which the cross-linking can be broken by UV treatment, the dielectric layer may be formed of any insulating material which can be deposited and controllably etched. The dielectric material may be solution processable. For example, the dielectric layer may be an organic photoresist such as a polyimide which can be readily spin coated and patterned. Alternatively, the dielectric layer may be an inorganic material such as $SiO_2$. The deposition and patterning of such materials is well known in the art and will not be discussed in more detail here.

The organic semi-conductive material may be solution processable such that it can be deposited from solution by, for example, spin-coating or ink-jet printing. The organic semi-conductive material may comprise a polymer or dendrimer as these have proved to be good solution processable materials. Many such semi-conductive materials are known in the art, for example, conjugated polymers and dendrimers utilized in organic light-emissive devices.

The gate electrode can be printed or deposited using other simple patterning techniques which are known in the art.

The thicker region of the dielectric layer may be utilised to reduce track leakage between lower and higher level metallization in a device such as a display (e.g. an active matrix organic light-emissive display).

Further details of materials and processes applicable to the invention are set out below.

Substrate

The substrate may be rigid or flexible. Rigid substrates may be selected from glass or silicon and flexible substrates may comprise thin glass or plastics such as poly(ethylene terephthalate) (PET), poly(ethylene-naphthalate) PEN, polycarbonate and polyimide.

The organic semiconductive material may be made solution processable through the use of a suitable solvent. Exemplary solvents include mono- or poly-alkylbenzenes such as toluene and xylene; tetralin; and chloroform. Preferred solution deposition techniques include spin coating and ink jet printing. Other solution deposition techniques include dip-coating; roll printing; and screen printing. In cases where a solution is dispensed from a nozzle, the printing process may be either continuous or discontinuous. For example, in a continuous process a continuous strip of organic semiconductive material may be dispensed from a nozzle, whereas discontinuous drops are dispensed from a nozzle in a discontinuous printing process.

Organic Semiconductor Materials

Preferred organic semiconductor materials include small molecules such as optionally substituted pentacene; optionally substituted polymers such as polyarylenes, in particular polyfluorenes and polythiophenes; and oligomers. Blends of materials, including blends of different material types (e.g. a polymer and small molecule blend) may be used.

Source and Drain Electrodes

For a p-channel OTFT, preferably the source and drain electrodes comprise a high workfunction material, preferably a metal, with a workfunction of greater than 3.5 eV, for example gold, platinum, palladium, molybdenum, tungsten, or chromium. More preferably, the metal has a workfunction in the range of from 4.5 to 5.5 eV. Other suitable compounds, alloys and oxides such as molybdenum trioxide and indium tin oxide may also be used. The source and drain electrodes may be deposited by thermal evaporation and patterned using standard photolithography and lift off techniques as are known in the art.

Alternatively, conductive polymers may be deposited as the source and drain electrodes. An example of such a conductive polymers is poly(ethylene dioxythiophene) (PEDOT) although other conductive polymers are known in the art. Such conductive polymers may be deposited from solution using, for example, spin coating or ink jet printing techniques and other solution deposition techniques discussed above.

For an n-channel OTFT, preferably the source and drain electrodes comprise a material, for example a metal having a workfunction of less than 3.5 eV such as calcium or barium or a thin layer of metal compound, in particular an oxide or fluoride of an alkali or alkali earth metal for example lithium fluoride, barium fluoride and barium oxide. Alternatively, conductive polymers may be deposited as the source and drain electrodes.

The source and drain electrodes are preferably formed from the same material for ease of manufacture. However, it will be appreciated that the source and drain electrodes may be formed of different materials for optimisation of charge injection and extraction respectively.

The length of the channel defined between the source and drain electrodes may be up to 500 microns, but preferably the length is less than 200 microns, more preferably less than 100 microns, most preferably less than 20 microns.

Gate Electrode

The gate electrode can be selected from a wide range of conducting materials for example a metal (e.g. gold) or metal compound (e.g. indium tin oxide). Alternatively, conductive polymers may be deposited as the gate electrode. Such conductive polymers may be deposited from solution using, for example, spin coating or ink jet printing techniques and other solution deposition techniques discussed above Thicknesses of the gate electrode, source and drain electrodes may be in the region of 5-200 nm, although typically 50 nm as measured by Atomic Force Microscopy (AFM), for example.

Dielectric Layer

The dielectric layer comprises a dielectric material selected from insulating materials having a high resistivity. The dielectric constant, k, of the dielectric is typically around 2-3 although materials with a high value of k are desirable because the capacitance that is achievable for an OTFT is directly proportional to k, and the drain current $I_D$ is directly proportional to the capacitance. Thus, in order to achieve high drain currents with low operational voltages, OTFTs with thin dielectric layers in the channel region are preferred.

The dielectric material may be organic or inorganic. Preferred inorganic materials include $SiO_2$, SiNx and spin-on-glass (SOG). Preferred organic materials are generally polymers and include insulating polymers such as poly vinylalcohol (PVA), polyvinylpyrrolidine (PVP), acrylates such as polymethylmethacrylate (PMMA) and benzocyclobutanes (BCBs) available from Dow Corning. The insulating layer may be formed from a blend of materials or comprise a multi-layered structure.

The dielectric material may be deposited by thermal evaporation, vacuum processing or lamination techniques as are known in the art. Alternatively, the dielectric material may be deposited from solution using, for example, spin coating or ink jet printing techniques and other solution deposition techniques discussed above.

If the dielectric material is deposited from solution onto the organic semiconductor, it should not result in dissolution of the organic semiconductor. Likewise, the dielectric material should not be dissolved if the organic semiconductor is deposited onto it from solution. Techniques to avoid such dissolution include: use of orthogonal solvents, that is use of a solvent for deposition of the uppermost layer that does not dissolve the underlying layer; and crosslinking of the underlying layer.

The thickness of the insulating layer is preferably less than 2 micrometers.

Further Layers

Other layers may be included in the device architecture. For example, a self assembled monolayer (SAM) may be deposited on the gate, source or drain electrodes, substrate, insulating layer and organic semiconductor material to promote crystallity, reduce contact resistance, repair surface characteristics and promote adhesion where required. In particular, the dielectric surface in the channel region may be provided with a monolayer comprising a binding region and an organic region to improve device performance, e.g. by improving the organic semiconductor's morphology (in particular polymer alignment and crystallinity) and covering charge traps, in particular for a high k dielectric surface. Exemplary materials for such a monolayer include chloro- or alkoxy-silanes with long alkyl chains, eg octadecyltrichlorosilane.

OTFT Applications

OTFTs according to embodiments of the present invention have a wide range of possible applications. One such application is to drive pixels in an optical device, preferably an organic optical device. Examples of such optical devices include photoresponsive devices, in particular photodetectors, and light-emissive devices, in particular organic light emitting devices. OTFTs are particularly suited for use with active matrix organic light emitting devices, e.g. for use in display applications. An organic light-emitting device comprises an anode, a cathode and a layer comprising an organic light-emitting material therebetween that emits light when a potential difference is applied across the anode and the cathode. In addition to the layer of light emitting material, charge transporting or blocking layers, or exciton blocking layers, may be provided between the anode and cathode.

Organic thin film transistors according to embodiments of the present invention have many common structural features with organic light-emissive displays and may be formed using similar techniques and materials. For example, the dielectric layer of the present invention may be formed of the same material as that used for bank structures defining pixels of an organic light-emissive display and may thus be formed as a common layer. As such, according to one advantageous arrangement, the organic thin film transistors and the organic light-emissive pixels of an active matrix organic light-emissive display are formed on a common substrate and the dielectric layer discussed herein forms the bank structure for the organic light-emissive pixels.

It will be appreciated that pixel circuits comprising an OTFT and an optically active pixel area (e.g. light emitting or light sensing pixel area) may comprise further elements. In particular, an OLED pixel circuit may comprise an OTFT according to the invention as a driving transistor and will typically comprise at least one further (organic or inorganic) transistor in addition to the driving transistor, and at least one capacitor.

While this invention has been particularly shown and described with reference to preferred embodiments thereof, it will be understood by those skilled in the art that various changes in form and detail may be made therein without departing from the scope of the invention as defined by the appended claims.

The invention claimed is:

1. A method of forming an organic thin film transistor of the top-gate type comprising:
   providing a structure comprising source and drain electrodes with a channel region therebetween, a gate electrode, and a dielectric layer disposed between the source and drain electrodes and the gate electrode, the providing step comprising:
   forming the source and drain electrode over a transparent substrate, the source and drain electrode being spaced apart with the channel region therebetween;

forming a layer of organic semi-conductive material in at least the channel region between the source and drain electrodes; and patterning the dielectric layer using the source and drain electrodes as a mask to form a region of dielectric material in the channel region which is thinner than regions of dielectric material adjacent the channel region, the patterning step comprising:

projecting light through the transparent substrate to treat the dielectric layer in the channel region;

forming a region of the dielectric layer in the channel region which is preferentially etchable relative to regions of the dielectric layer over the source and drain electrodes; and etching said region of the dielectric layer in the channel region to reduce the thickness of the dielectric layer in the channel region, the method further comprising forming the gate electrode over the dielectric layer in at least the channel region.

2. A method according to claim 1, comprising depositing the dielectric material in the channel region to a thickness of at least 300 nm and etching the dielectric material to a depth of at least 300 nm.

3. A method according to claim 1, wherein the ratio of respective thicknesses of the dielectric layer in the channel region before and after patterning of the dielectric layer is at least 2:1.

4. A method according to claim 1, wherein the organic thin film transistor is of the bottom-gate type, the providing step comprises: forming the gate electrode on a substrate; forming the dielectric layer over the gate electrode; and forming the source and drain electrodes over the dielectric layer, the source and drain electrode being spaced apart with the channel region therebetween located over the gate electrode, and the patterning step comprises: etching the dielectric layer in the channel region using the source and drain electrodes as an etch mask to reduce the thickness of the dielectric layer in the channel region, the method further comprising forming a layer of organic semi-conductive material in at least the channel region between the source and drain electrodes.

5. A method according to claim 1, wherein the dielectric layer comprises an organic material.

6. A method according to claim 1, wherein the dielectric layer comprises a solution processable material.

7. A method according to claim 1, wherein the dielectric layer comprises an organic photoresist.

8. A method according to claim 1, wherein the patterning step comprises cross-linking the dielectric layer and exposing to light, using the source and drain electrodes as a mask whereby the dielectric layer is exposed in the channel region and shaded behind the source and drain electrodes, the light breaking the cross-linking of the dielectric layer in the channel region.

9. A method according to claim 1, further comprising treating a surface of the dielectric material in the channel region to repair any damage caused by the patterning step.

10. A method according to claim 9, wherein said treating comprises providing a capping layer over said surface of the dielectric material in the channel region.

11. A method according to claim 10, wherein said capping layer comprises a self-assembled monolayer.

12. A method according to claim 1, comprising printing the organic semiconductive material into a well defined by the thinner region of dielectric material.

13. An organic thin film transistor formed by the method of claim 1.

14. An organic light-emissive device comprising the organic thin film transistor according claim 13.

* * * * *